United States Patent
Kim et al.

(10) Patent No.: US 11,404,512 B2
(45) Date of Patent: Aug. 2, 2022

(54) DISPLAY APPARATUS INCLUDING AUXILIARY PIXELS

(71) Applicant: SAMSUNG DISPLAY CO., LTD., Yongin-si (KR)

(72) Inventors: Changmok Kim, Yongin-si (KR); Dongwon Han, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 278 days.

(21) Appl. No.: 16/719,522

(22) Filed: Dec. 18, 2019

(65) Prior Publication Data
US 2020/0258967 A1 Aug. 13, 2020

(30) Foreign Application Priority Data
Feb. 7, 2019 (KR) .................. 10-2019-0014441

(51) Int. Cl.
*H01L 27/32* (2006.01)
*H01L 27/12* (2006.01)

(52) U.S. Cl.
CPC ...... *H01L 27/3262* (2013.01); *H01L 27/1218* (2013.01); *H01L 27/3225* (2013.01); *H01L 27/3281* (2013.01)

(58) Field of Classification Search
CPC ............ H01L 27/3262; H01L 27/1218; H01L 27/3225; H01L 27/3281; H01L 27/326; H01L 27/3244; H01L 27/124; H01L 27/3276; H01L 27/3211; H01L 51/50; G09G 3/3208; G09G 3/3233
See application file for complete search history.

(56) References Cited

U.S. PATENT DOCUMENTS

| | | | |
|---|---|---|---|
| 2017/0162111 A1* | 6/2017 | Kang | ................... G09G 3/3233 |
| 2017/0194416 A1 | 7/2017 | Chen et al. | |
| 2017/0288003 A1* | 10/2017 | Kim | .................. H01L 27/3276 |
| 2017/0355313 A1 | 12/2017 | Park et al. | |
| 2018/0165533 A1 | 6/2018 | Cho et al. | |
| 2018/0190710 A1 | 7/2018 | Ryu et al. | |
| 2019/0205596 A1* | 7/2019 | Kim | ................... H01L 27/3244 |
| 2019/0279599 A1* | 9/2019 | Li | ........................... G01S 17/08 |

FOREIGN PATENT DOCUMENTS

| | | |
|---|---|---|
| KR | 10-0573160 | 3/2006 |
| KR | 10-2017-0141311 | 12/2017 |
| KR | 10-2018-0062538 | 6/2018 |
| KR | 10-2018-0067196 | 6/2018 |

* cited by examiner

*Primary Examiner* — Julia Slutsker
(74) *Attorney, Agent, or Firm* — F. Chau & Associates, LLC

(57) ABSTRACT

A display apparatus includes a substrate that includes a sensor area, a first non-display area at least partially surrounding the sensor area, and a display area at least partially surrounding the first non-display area. A plurality of auxiliary pixels is disposed in the sensor area. The plurality of auxiliary pixels is configured for passive matrix driving. A plurality of main pixels is disposed in the main display area and is configured for active matrix driving.

20 Claims, 10 Drawing Sheets

DISPLAY APPARATUS INCLUDING AUXILIARY PIXELS

CROSS-REFERENCE TO RELATED APPLICATION

This application claims the benefit of and priority to Korean Patent Application No. 10-2019-0014441, filed on Feb. 7, 2019, in the Korean Intellectual Property Office, the disclosure of which is herein incorporated by reference in its entirety.

TECHNICAL FIELD

The present disclosure relates to display apparatuses and, more specifically, to display apparatuses including auxiliary pixels.

DISCUSSION OF THE RELATED ART

Display apparatuses are widely used in various electronic devices as a means for providing information and images to a user. While display apparatuses were traditionally only found in rectangular forms, modern display apparatuses may have a wide variety of different shapes and sizes. Moreover, while display apparatuses traditionally only served to display an image, modern display apparatuses may incorporate other input/output devices such as sensors. These sensors are most often disposed within a bezel area of the display apparatus in which no image is displayed.

As the size of the bezel area of modern display devices grows increasingly small, sensors have been moved to the display area of the display device, where they may appear within a cutout or notch on the display area in which no image is displayed. This cutout or notch may be partially or fully surrounded by the display area of the display device.

SUMMARY

One or more embodiments of the present inventive concept may include display apparatuses having a display area and a sensor area. An image may be displayed within the display area. One or more sensors may be disposed within the sensor area. These sensors may be configured to provide additional functionality to the display apparatuses.

According to one or more embodiments of the present inventive concept, a display apparatus includes a substrate including a sensor area. A first non-display area surrounds the sensor area. A display area at least partially surrounds the first non-display area. A plurality of auxiliary pixels is disposed within in the sensor area. These auxiliary pixels are configured to be driven by passive matrix driving. A plurality of main pixels is disposed in the main display area. These main pixels are configured to be driven by active matrix driving. A plurality of auxiliary thin film transistors is disposed in the first non-display area. These auxiliary thin film transistors are configured to drive the plurality of auxiliary pixels.

The display apparatus may further include a component arranged on a lower surface of the substrate such that the component corresponds to the sensor area.

The plurality of auxiliary pixels may be located in a region where a plurality of horizontal electrodes extending primarily in a first direction and a plurality of vertical electrodes extending primarily in a second direction, crossing the first direction, intersect each other.

Each of the plurality of main pixels may include at least one thin-film transistor.

Each of the plurality of auxiliary pixels may include a horizontal electrode, a vertical electrode, and an intermediate layer arranged between the horizontal electrode and the vertical electrode. Each of the plurality of auxiliary thin film transistors may include a first auxiliary thin film transistor connected to the horizontal electrode and a second auxiliary thin film transistor connected to the vertical electrode.

Each of the plurality of main pixels may include a pixel electrode, an intermediate layer, and a counter electrode. A source electrode or a drain electrode of the first auxiliary thin film transistor may be connected to the counter electrode.

A gate electrode of the second auxiliary thin film transistor may be connected to a scan line for transmitting a scan signal to the plurality of main pixels.

A source electrode or a drain electrode of the second auxiliary thin film transistor may be connected to a driving voltage line located in the display area.

The display apparatus may further include a lower protective film disposed on a lower surface of the substrate, in which the lower protective film may include an opening corresponding to the sensor area.

The display apparatus may further include a plurality of lines extending from the display area, arranged in the first non-display area, and detouring along an edge of the sensor area.

Each of the plurality of lines may include a curved portion in the first non-display area.

A size of a light-emitting area of each of the plurality of auxiliary pixels may be greater than a size of a light-emitting area of each of the plurality of main pixels.

A resolution implemented in the sensor area may be within a range of about 50 ppi to about 400 ppi.

According to one or more embodiments of the present inventive concept, a display apparatus includes a substrate including an auxiliary display area, a first non-display area surrounding the sensor area, and a display area at least partially surrounding the first non-display area. A plurality of auxiliary pixels is disposed in the auxiliary display area. These auxiliary pixels are configured to be driven by passive matrix driving. A plurality of main pixels is disposed in the main display area. These main pixels are configured to be driven by active matrix driving. A component is disposed under the substrate to correspond to the auxiliary display area.

The component may be a sensor that is configured to cast and/or sense infrared light.

The sensor area may have an infrared transmittance of about 15% or more.

The plurality of auxiliary pixels may be located in a region where a plurality of horizontal electrodes extending primarily in a first direction and a plurality of vertical electrodes extending primarily in a second direction, crossing the first direction, intersect each other.

The display apparatus may further include a plurality of auxiliary thin film transistors for driving the plurality of auxiliary pixels. The auxiliary thin film transistors may be arranged in the first non-display area.

The display apparatus may further include a plurality of lines extending from the display area, arranged in the first non-display area, and detouring along an edge of the auxiliary display area.

The display apparatus may further include a lower protective film disposed on a lower surface of the substrate, in which the lower protective film includes an opening corresponding to the sensor area.

BRIEF DESCRIPTION OF THE DRAWINGS

A more complete appreciation of the present disclosure and many of the attendant aspects thereof will become apparent and more readily appreciated from the following description of the embodiments, taken in conjunction with the accompanying drawings in which.

DETAILED DESCRIPTION

Figure 1:
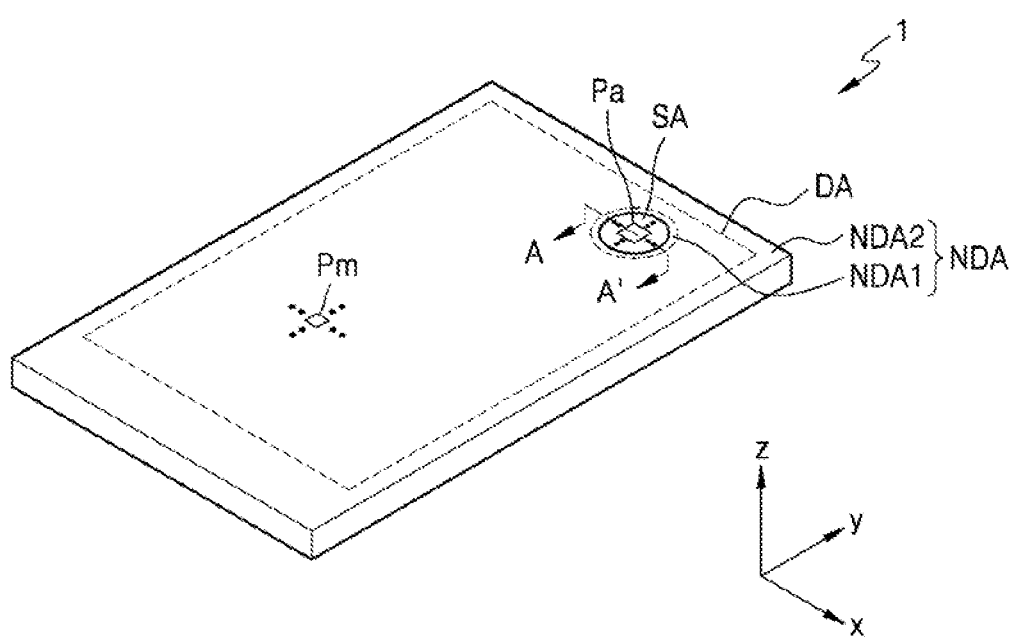
FIG. 1 is a schematic perspective view illustrating a display apparatus according to an exemplary embodiment of the present inventive concept.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

In the specification and drawings, like reference numerals may refer to like elements. To the extent that a detailed description of some elements has been omitted, it may be assumed that these elements are at least similar to corresponding elements that have been described elsewhere in the patent application.

It will be understood that although the terms "first," "second," etc. may be used herein to describe various components, these components should not be limited by these terms. These terms are only used to distinguish one component from another.

It will be further understood that the terms "comprises" and/or "comprising" are used herein specify the presence of stated features or components, but do not preclude the presence or addition of one or more other features or components. However, the phrase "consisting of" is intended to preclude the presence of additional features or components.

It will be understood that when a layer, region, or component is referred to as being "formed on" another layer, region, or component, it can be directly or indirectly formed on the other layer, region, or component and intervening layers, regions, or components may be present therebetween.

Sizes of components in the drawings may be exaggerated for convenience of explanation. While the present invention is not limited to the particular sizes and thicknesses of the components shown, it is to be understood that the relative sizes and angles of the various structures and components may be taken as describing at least a particular embodiment of the present inventive concept.

It is to be understood that the particular order of process steps described herein may be changed from what is described. For example, two consecutively described processes may be performed substantially at the same time or performed in an order opposite to the described order.

FIG. 1 is a schematic perspective view illustrating a display apparatus 1 according to an exemplary embodiment of the present inventive concept.

Referring to FIG. 1, the display apparatus 1 may include a display area DA that emits light and a non-display area NDA that does not emit light. The non-display area NDA may at least partially surround the display area SA and the non-display area NDA may substantially correspond to a bezel region of the display apparatus 1. A plurality of main pixels Pm driven by an active matrix (AM) method may be disposed in the display area DA. The display apparatus 1 may display a main image by using the light emitted from the plurality of main pixels arranged in the display area DA.

The display apparatus 1 may include a sensor area SA. The sensor area SA may be disposed either fully within the display area DA, so as to form a cut-out or hole, or may be disposed on a side edge of the display area DA, so as to form a notch. Various electronic components, such as a sensor that senses visible and/or infrared light or a microphone for detecting sound, may be disposed within the sensor area SA.

For example, the various electronic components may be disposed behind the sensor area SA and the sensor area SA itself may be configured to allow for light and/or sound to be transmitted therethrough. In this way, light and/or sound from the outside may penetrate the sensor area SA and be detected by the various electronic components thereunder. According to an exemplary embodiment of the present inventive concept, when an infrared light transmits through the sensor area SA, light transmittance with respect to a wavelength of 940 nm may be about 15% or more or 30% or more, and more preferably, 50% or more, 70% or more, 80% or more, 85% or more, or 90% or more.

According to an exemplary embodiment of the present inventive concept, the sensor area SA may be configured to provide an image by using light emitted from auxiliary pixels Pa that are disposed within the sensor area SA. The auxiliary pixels Pa may be driven by a passive matrix (PM) method. The image provided from the sensor area SA is an auxiliary image having a resolution lower than the image provided from the display area DA. However, it is to be noted that both the display area DA and the sensor area SA may be configured to display images and thus, the sensor area SA may be less noticeable than a corresponding sensor area that does not include auxiliary pixels. In this way, the sensor area SA might not appear as a cut-out or notch but rather, may be difficult to observe.

The sensor area SA may be at least partially surrounded by the display area DA, and, as an embodiment, FIG. 1 illustrates that the sensor area SA is entirely surrounded by the display area DA. The non-display area NDA may include a first non-display area NDA1 at least partially surrounding the sensor area SA and a second non-display area NDA2 at least partially surrounding an outer portion of the display area DA. For example, the first non-display area NDA1 may entirely surround the sensor area SA, the display area DA may entirely surround the first non-display area NDA1, and the second non-display area NDA2 may entirely surround the display area DA. Although, it is not necessary that any of these elements entirely surround and/or be entirely surrounded, and in instances where the sensor area SA is disposed on an outer edge of the display area DA, the first non-display area NDA1 may partially surround the sensor area SA, the display area SA may partially surround the first non-display area NDA1, and the second non-display area NDA2 may partially surround the display area DA.

In the following description, an organic light-emitting display apparatus is described as an example of the display apparatus 1 illustrated in FIG. 1, but the display apparatus of the present disclosure is not limited thereto. According to an exemplary embodiment of the present inventive concept, various types of display apparatuses such as inorganic light-emitting (EL) display apparatuses or quantum dot light-emitting display apparatuses may be used.

Although FIG. 1 illustrates that the sensor area SA is located at one side (upper right side) of the display area DA and illustrates that the display area DA is rectangular, the present disclosure is not limited thereto. The shape of the display area DA may be circular, oval, or polygonal such as triangular or pentagonal, and the position of the sensor area SA may be variously changed.

Figure 2:
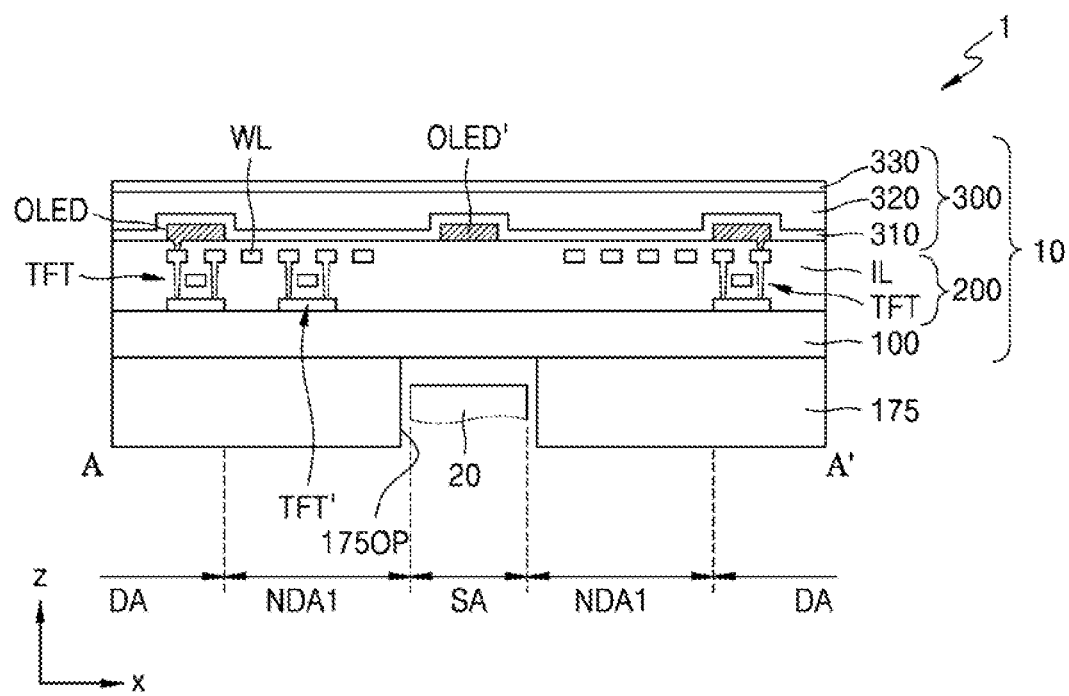
FIG. 2 is a schematic cross-sectional view illustrating a display apparatus according to an exemplary embodiments of the present inventive concept.

FIG. 2 is a schematic cross-sectional view of the display apparatus 1 according to exemplary embodiments of the present inventive concept, which may correspond to a cross-section taken along line A-A' of FIG. 1.

Referring to FIG. 2, the display apparatus 1 may include a display panel 10 including various display elements and a component 20 corresponding to the sensor area SA.

The display panel 10 may include a substrate 100, a display element layer 200 disposed on the substrate 100, and a thin film encapsulation layer 300 as a sealing member for sealing the display element layer 200. Furthermore, the display panel 10 may further include a lower protective film 175 disposed under the substrate 100.

The substrate 100 may include glass or polymer resin. The polymer resin may include polyethersulfone (PES), polyacrylate, polyetherimide (PEI), polyethylene naphthalate (PEN), polyethylene terephthalate (PET), polyphenylene sulfide (PPS), polyarylate, polyimide (PI), polycarbonate (PC), and/or cellulose acetate propionate (CAP). The substrate 100 including polymer resin may have characteristics of being flexible, rollable, and/or bendable. The substrate 100 may have a multilayer structure including a layer having the above-described polymer resin and an inorganic layer.

As used herein, the term "flexible" means able to be flexed to a non-trivial degree and restored to its original configuration without cracking or breaking. Similarly, "rollable" means able to be rolled up to a non-trivial degree and restored to its original configuration without cracking or breaking. Similarly, "bendable" means able to be bent to a non-trivial degree and restored to its original configuration without cracking or breaking. A "non-trivial degree" is understood to be a degree of deformation that is noticeable.

The display element layer 200 may include a circuit layer including main and auxiliary thin film transistors TFT and TFT', main and auxiliary organic light-emitting diodes OLED and OLED' as display elements, and an insulating layer IL disposed therebetween.

The main thin film transistor TFT and the main organic light-emitting diode OLED connected thereto may be disposed in the display area DA. The auxiliary thin film transistor TFT' and some word lines WL of the display element layer 200 may be disposed in the first non-display area NDA1. The auxiliary organic light-emitting diode OLED' may be disposed in the sensor area SA. The auxiliary thin film transistor TFT' may be a thin film transistor for passive matrix (PM) driving of the auxiliary organic light-emitting diode OLED' disposed in the sensor area SA. The auxiliary thin film transistor TFT' is disposed in the first non-display area NDA1, but does not overlap the component 20.

The component 20 may be disposed in the sensor area SA. The component 20 may be an electronic component for detecting and/or projecting light and/or sound. For example, the component 20 may be a sensor for receiving and using light such as an infrared sensor, a sensor for measuring a distance or recognizing a fingerprint by outputting and detecting light or sound, a compact lamp for outputting light, or a speaker for outputting sound. For an electronic component using light, light of various wavelength bands such as a visible light, an infrared light, or an ultraviolet light may be used. A plurality of components may be provided as the component 20 disposed in the sensor area SA. For example, a light-emitting device and a light-receiving device may be provided together as the component 20 in the sensor area SA.

The thin film encapsulation layer 300 may include at least one inorganic capsulation layer and at least one organic capsulation layer. In this regard, FIG. 2 illustrates first and second inorganic capsulation layers 310 and 330 and an organic capsulation layer 320 disposed therebetween.

The first and second inorganic capsulation layers 310 and 330 may include at least one inorganic insulating material such as an aluminum oxide, a titanium oxide, a tantalum oxide, a hafnium oxide, a zinc oxide, a silicon oxide, a silicon nitride, and/or a silicon oxynitride. The organic capsulation layer 320 may include a polymer-based material. The polymer-based material may include acrylic resin, epoxy resin, polyimide, and/or polyethylene.

The lower protective film 175 may be attached to a lower surface of the substrate 100 to support and protect the substrate 100. The lower protective film 175 may include an opening 175OP corresponding to the sensor area SA. As the opening 175OP is provided in the lower protective film 175, the light transmittance of the sensor area SA may be increased. The lower protective film 175 may include PET or PI.

When the substrate 100 includes glass, the lower protective film 175 may be omitted.

Constituent elements such as an input detection member for detecting a touch input, a reflection prevention member including a polarizer, a retarder, or a color filter and a black matrix, and a transparent window may be further provided on the display panel 10.

According to exemplary embodiments of the present inventive concept, although it is illustrated that the thin film encapsulation layer 300 is used as an encapsulation member for sealing the display element layer 200, the present disclosure is not limited thereto. For example, a sealing substrate that is connected to the substrate 100 by a sealant or frit may be used as the member for sealing the display element layer 200.

Figure 3:
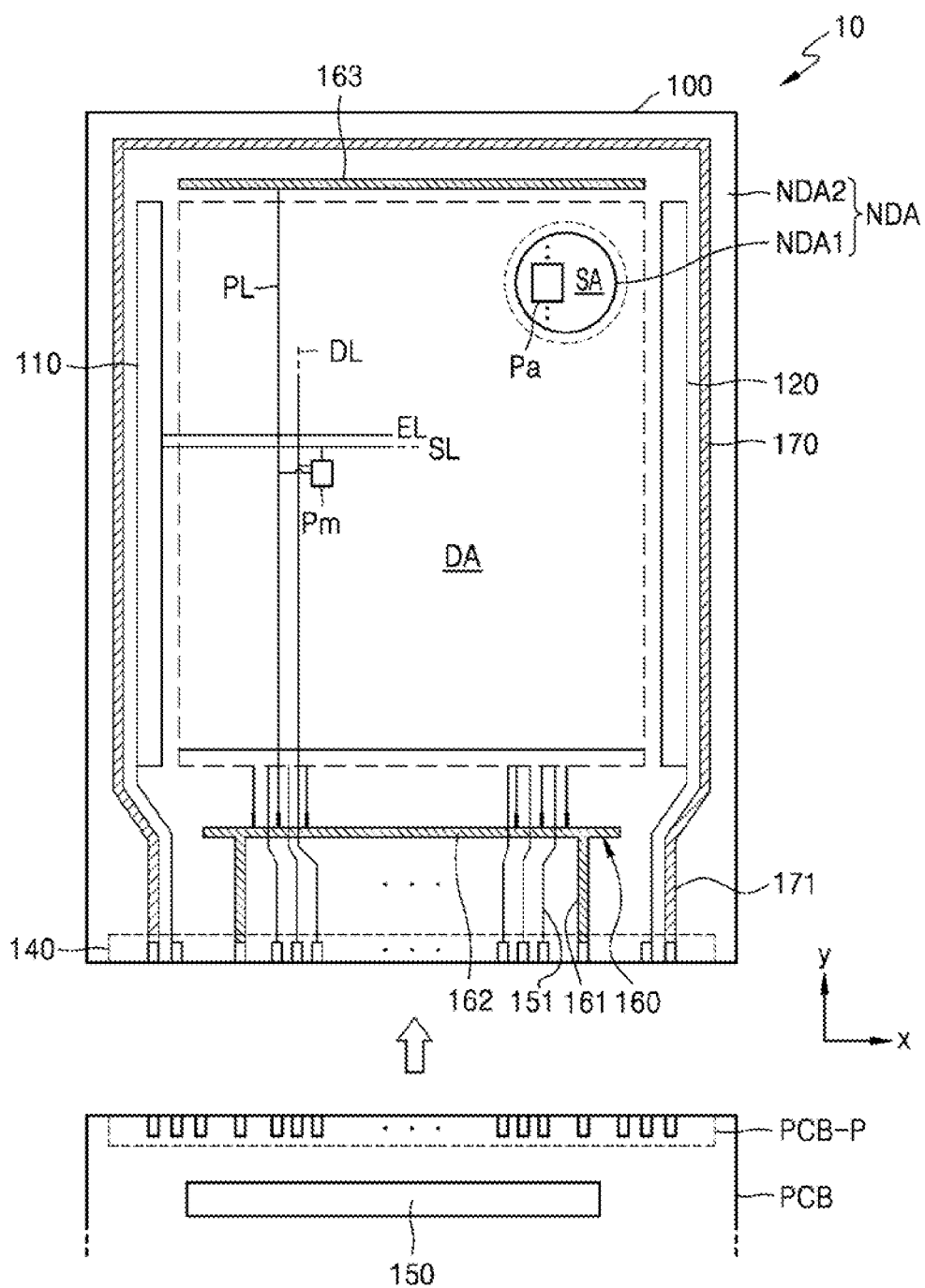
FIG. 3 is a schematic plan view illustrating a display apparatus according to an exemplary embodiment of the present inventive concept.

FIG. 3 is a schematic plan view illustrating the display apparatus 1 according to an exemplary embodiment of the present inventive concept.

Referring to FIG. 3, the display panel 10 may include a plurality of main pixels Pm configured to be driven by active matrix (AM) driving. The main pixels Pm are disposed in the display area DA. Each of the main pixels Pm may include a display element such as an organic light-emitting diode. Each main pixels Pm may emit light of, for example, a red, green, blue, or white color, through the organic light-emitting diode. In the present specification, each of the main pixels Pm may be understood as a pixel that emits light of one of the red, green, blue, and white colors, as described above. The display area DA may be covered by the encapsulation member that is described above with respect to FIG. 2, and thus may be protected from external air or moisture.

The sensor area SA may be disposed inside the display area DA, and a plurality of auxiliary pixels Pa configured for PM driving may be disposed in the sensor area SA. Each of the auxiliary pixels Pa may include a display element such as an organic light-emitting diode. Each of the auxiliary pixels Pa may emit light of, for example, a red, green, blue, or white color, through the organic light-emitting diode. In the present specification, the auxiliary pixel Pa may be understood as a pixel that emits light of one of the red, green, blue, and white colors, as described above.

The diameter of the sensor area SA may be within a range from about 2 mm to about 5 mm, and a resolution thereof may be within a range from about 50 pixels per inch (ppi) to about 400 ppi. The number of auxiliary pixels Pa to be included in the sensor area SA, that is, the pixels including subpixels of RGB, may be about 100 including rows of 10 pixels by columns of 10 pixels.

The sensor area SA may have a transmittance of about 15% to 50% or more with respect to light such as an infrared light, and a component such as a sensor using an infrared light may be disposed thereunder.

The first non-display area NDA1 where the pixels Pm and Pa are not disposed is located between the sensor area SA and the display area DA. The auxiliary thin film transistor TFT' to drive the auxiliary pixels Pa disposed in the sensor area SA may be disposed in the first non-display area NDA1. Furthermore, lines to apply a signal or power to the main pixels Pm separated with respect to the sensor area SA may be disposed in the first non-display area NDA1. A structure thereof is presented below with reference to FIG. 6.

Each of the pixels Pm and Pa may be electrically connected to outer circuits disposed in the non-display area NDA, for example, the second non-display area NDA2. A first scan driving circuit 110, a second scan driving circuit 120, a terminal 140, a data driving circuit 150, a first power supply line 160, and a second power supply line 170 may be disposed in the second non-display area NDA2.

The first scan driving circuit 110 may provide a scan signal Sn to each of the main pixels Pm via a scan line SL. The first scan driving circuit 110 may provide an emission control signal to each of the main pixels Pm via an emission control line EL. The second scan driving circuit 120 may be disposed parallel to the first scan driving circuit 110 with the display area DA therebetween. While some of the main pixels Pm disposed in the display area DA may be electrically connected to the first scan driving circuit 110, the other main pixels Pm may be electrically connected to the second scan driving circuit 120. According to an exemplary embodiment of the present inventive concept, the second scan driving circuit 120 may be omitted.

The terminal 140 may be disposed at one side of the substrate 100. The terminal 140 may be electrically connected to a printed circuit board (PCB) without being covered by the insulating layer IL. A terminal PCB-P of the PCB may be electrically connected to the terminal 140 of the display panel 10. The PCB is configured to transmit a signal or power from a controller to the display panel 10. A control signal generated by the controller may be transmitted to each of the first and second scan driving circuits 110 and 120 via the PCB. The controller may provide first and second power voltages ELVDD and ELVSS (see FIGS. 4A and 4B) to the first and second power supply lines 160 and 170 via first and second connection lines 161 and 171. The first power voltage ELVDD may be provided to each of the main pixels Pm via a driving voltage line PL connected to the first power supply line 160, and the second power voltage ELVSS may be provided to a counter electrode of each of the main pixels Pm connected to the second power supply line 170.

The data driving circuit 150 may be electrically connected to a data line DL. A data signal of the data driving circuit 150 may be provided to each of the main pixels Pm via a connection line 151 connected to the terminal 140 and the data line DL connected to the connection line 151. Although FIG. 3 illustrates that the data driving circuit 150 is disposed on the PCB, the data driving circuit 150 may be disposed on the substrate 100. For example, the data driving circuit 150 may be disposed between the terminal 140 and the first power supply line 160.

The first power supply line 160 may include a first sub-line 162 and a second sub-line 163 extending primarily in parallel along an x-direction with the display area DA disposed therebetween. The second power supply line 170 may have a loop shape with one side opened and may partially surround the display area DA.

The first and second scan driving circuits 110 and 120 and the data driving circuit 150 may provide a signal or voltage to drive the auxiliary pixels Pa. Furthermore, the first power voltage ELVDD and the second power voltage ELVSS may be transmitted to the auxiliary pixels Pa. In some exemplary embodiments of the present inventive concept, lines to transmit the signals of the first and second scan driving circuits 110 and 120 and the data driving circuit 150 may be connected to the auxiliary thin film transistor TFT' to drive the auxiliary pixels Pa. In some exemplary embodiments of the present inventive concept, the first and second scan driving circuits 110 and 120 and the data driving circuit 150 may directly provide a voltage to drive the auxiliary pixels Pa.

According to exemplary embodiments of the present inventive concept, the main pixels Pm disposed in the display area DA are configured to be driven by AM driving, and the auxiliary pixels Pa disposed in the sensor area SA are configured to be driven by PM driving. The driving of the main pixels Pm and the driving of the auxiliary pixels Pa are described with reference to FIGS. 4A and 4B.

Figure 4A:
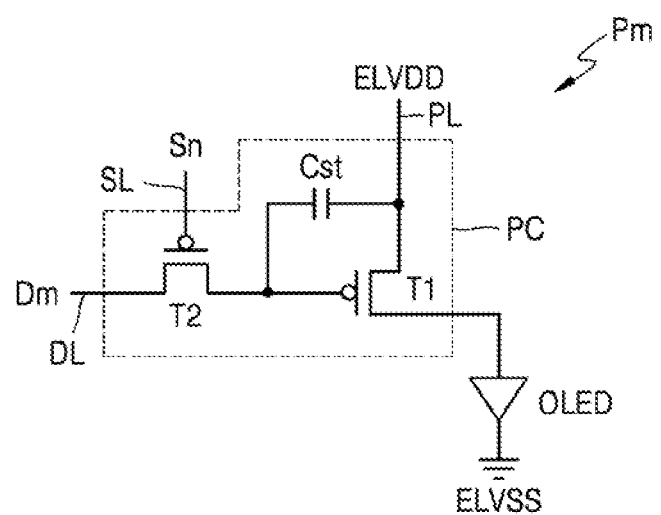
FIG. 4A is an equivalent circuit diagram illustrating a pixel configured to be driven by active matrix driving that may be disposed in a display area of a display apparatus, according to an exemplary embodiment of the present inventive concept.
Figure 4B:
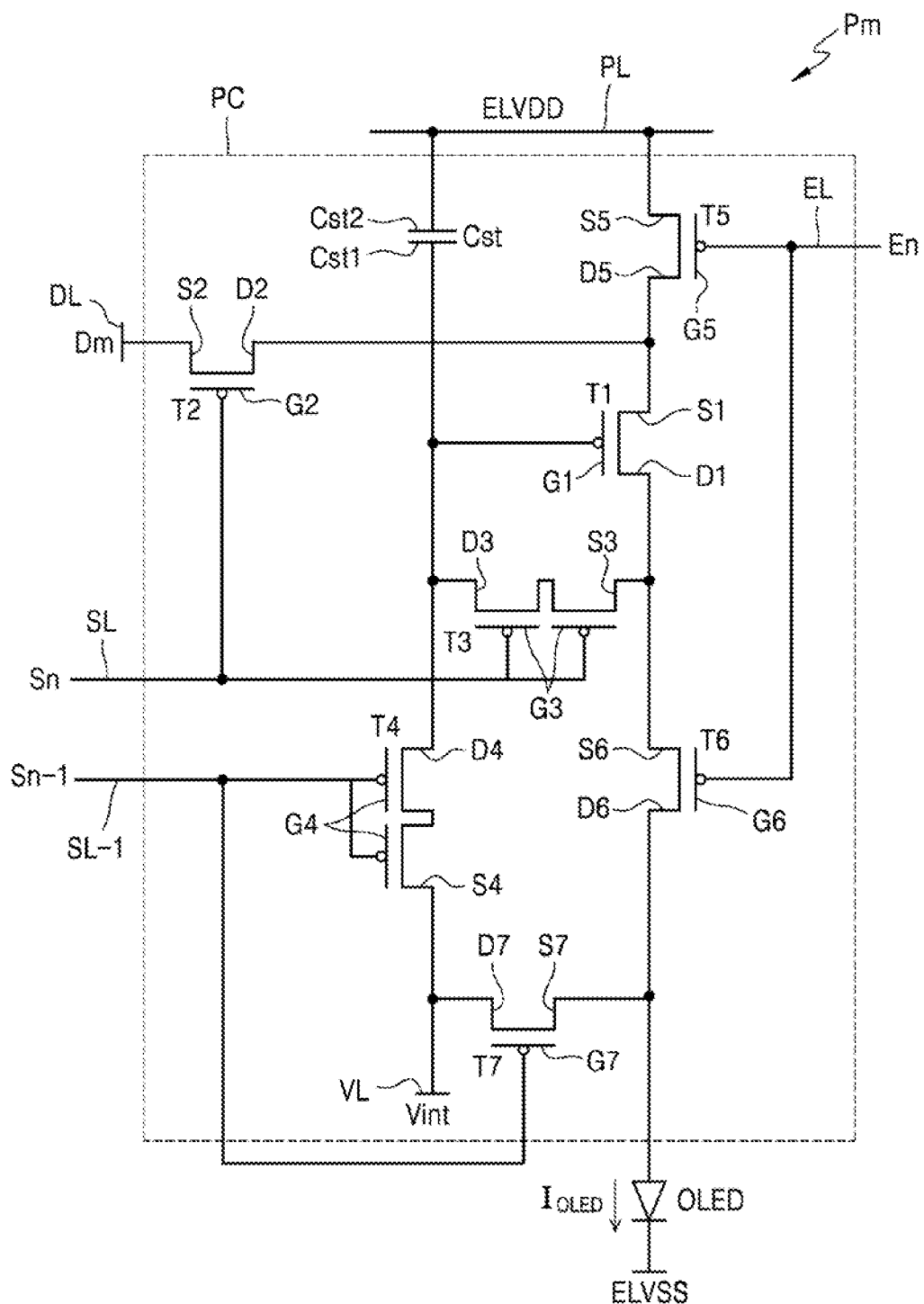
FIG. 4B is an equivalent circuit diagram illustrating a pixel configured to be driven by active matrix driving that may be disposed in a display area of a display apparatus, according to an exemplary embodiment of the present inventive concept.

FIGS. 4A and 4B are equivalent circuit diagrams of an exemplary main pixel of a display panel, according to an exemplary embodiment of the present inventive concept.

Referring to FIG. 4A, each of the main pixels Pm may include a pixel circuit PC connected to the scan line SL and the data line DL and an OLED connected to the pixel circuit PC.

The pixel circuit PC may include a driving thin film transistor T1, a switching thin film transistor T2, and a storage capacitor Cst. The switching thin film transistor T2 is connected to the scan line SL and the data line DL, and transmits a data signal Dm input through the data line DL to the driving thin film transistor T1, in response to the scan signal Sn input through the scan line SL.

The storage capacitor Cst is connected to the switching thin film transistor T2 and the driving voltage line PL, and stores a voltage corresponding to a difference between a voltage received from the switching thin film transistor T2 and the first power voltage (ELVDD or driving voltage) provided to the driving voltage line PL.

The driving thin film transistor T1 is connected to the driving voltage line PL and the storage capacitor Cst, and may control a driving current flowing in the OLED from the driving voltage line PL in response to a voltage value stored in the storage capacitor Cst. The OLED may emit light having a desired luminance as controlled by the driving current.

Although FIG. 4A illustrates that the pixel circuit PC includes two thin film transistors and one storage capacitor, the present disclosure is not limited thereto. As illustrated in FIG. 4B, the pixel circuit PC may include seven thin film transistors and one storage capacitor.

Referring to FIG. 4B, each of the main pixels Pm may include the pixel circuit PC and the main organic light-emitting diode OLED connected to the pixel circuit PC. The pixel circuit PC may include a plurality of thin film transistors and a storage capacitor. Thin film transistors and the storage capacitor may be connected to signal lines SL, SL−1, EL, and DL, an initialization voltage line VL, and the driving voltage line PL.

Although FIG. 4B illustrates that each of the main pixels Pm is connected to the signal lines SL, SL−1, EL, and DL, the initialization voltage line VL, and the driving voltage line PL, the present disclosure is not limited thereto. According to an exemplary embodiment of the present inventive concept, at least one of the signal lines SL, SL−1, EL, and DL, the initialization voltage line VL, and the driving voltage line PL may be shared by neighboring pixels.

A plurality of thin film transistors may include the driving thin film transistor T1, the switching thin film transistor T2, a compensation thin film transistor T3, a first initialization thin film transistor T4, an operation control thin film transistor T5, an emission control thin film transistor T6, and a second initialization thin film transistor T7.

The signal lines may include the scan line SL for transmitting the scan signal Sn, a previous scan line SL−1 for transmitting a previous scan signal Sn−1 to the first initialization thin film transistor T4 and the second initialization thin film transistor T7, the emission control line EL for transmitting an emission control signal En to the operation control thin film transistor T5 and the emission control thin film transistor T6, and the data line DL for transmitting the data signal Dm and intersecting the scan line SL. The driving voltage line PL transmits the driving voltage ELVDD to the driving thin film transistor T1, and the initialization voltage line VL transmits an initialization voltage Vint for initializing the driving thin film transistor T1 and a pixel electrode.

A driving gate electrode G1 of the driving thin film transistor T1 is connected to a first storage capacitor plate Cst1 of the storage capacitor Cst. A driving source electrode S1 of the driving thin film transistor T1 is connected to the driving voltage line PL thereunder via the operation control thin film transistor T5. A driving drain electrode D1 of the driving thin film transistor T1 is electrically connected to the pixel electrode of the main organic light-emitting diode OLED via the emission control thin film transistor T6. The driving thin film transistor T1 receives the data signal Dm according to a switching operation of the switching thin film transistor T2 and provides a driving current $I_{OLED}$ to the main organic light-emitting diode OLED.

A switching gate electrode G2 of the switching thin film transistor T2 is connected to the scan line SL. A switching source electrode S2 of the switching thin film transistor T2 is connected to the data line DL. A switching drain electrode D2 of the switching thin film transistor T2 is connected to the driving source electrode S1 of the driving thin film transistor T1 and to the driving voltage line PL via the operation control thin film transistor T5. The switching thin film transistor T2 in turned on in response to the scan signal Sn received through the scan line SL and performs a switching operation of transmitting the data signal Dm received through the data line DL to the driving source electrode S1 of the driving thin film transistor T1.

A compensation gate electrode G3 of the compensation thin film transistor T3 is connected to the scan line SL. A compensation source electrode S3 of the compensation thin film transistor T3 is connected to the driving drain electrode D1 of the driving thin film transistor T1 and to the pixel electrode of the OLED via the emission control thin film transistor T6. A compensation drain electrode D3 of the compensation thin film transistor T3 is connected to the first storage capacitor plate Cst1 of the storage capacitor Cst and to a first initialization drain electrode D4 of first initialization thin film transistor T4 and the driving gate electrode G1 of the driving thin film transistor T1. The compensation thin film transistor T3 is turned on in response to the scan signal Sn received through the scan line SL and electrically connects the driving gate electrode G1 of the driving thin film transistor T1 and the driving drain electrode D1, thereby diode-connecting the driving thin film transistor T1.

A first initialization gate electrode G4 of the first initialization thin film transistor T4 is connected to the previous scan line SL−1. A first initialization source electrode S4 of the first initialization thin film transistor T4 is connected to a second initialization drain electrode D7 of the second initialization thin film transistor T7 and to the initialization voltage line VL. The first initialization drain electrode D4 of the first initialization thin film transistor T4 is connected to the first storage capacitor plate Cst1 of the storage capacitor Cst, the compensation drain electrode D3 of the compensation thin film transistor T3, and the driving gate electrode G1 of the driving thin film transistor T1. The first initialization thin film transistor T4 is turned on in response to the previous scan signal Sn−1 received through the previous scan line SL−1 and transmits the initialization voltage Vint to the driving gate electrode G1 of the driving thin film transistor T1, thereby performing an initialization operation to initialize a voltage of the driving gate electrode G1 of the driving thin film transistor T1.

An operation control gate electrode G5 of the operation control thin film transistor T5 is connected to the emission control line EL. An operation control source electrode S5 of the operation control thin film transistor T5 is connected to the driving voltage line PL thereunder. An operation control drain electrode D5 of the operation control thin film transistor T5 is connected to the driving source electrode S1 of the driving thin film transistor T1 and a switching drain electrode D2 of the switching thin film transistor T2.

An emission control gate electrode G6 of the emission control thin film transistor T6 is connected to the emission control line EL. An emission control source electrode S6 of the emission control thin film transistor T6 is connected to the driving drain electrode D1 of the driving thin film transistor T1 and the compensation source electrode S3 of the compensation thin film transistor T3. An emission control drain electrode D6 of the emission control thin film transistor T6 is electrically connected to a second initialization source electrode S7 of the second initialization thin film transistor T7 and to the pixel electrode of the OLED.

As the operation control thin film transistor T5 and the emission control thin film transistor T6 are simultaneously turned on in response to the emission control signal En received through the emission control line EL, and transmit the driving voltage ELVDD to the main organic light-emitting diode OLED, thereby allowing the driving current $I_{OLED}$ to flow in the main organic light-emitting diode OLED.

A second initialization gate electrode G7 of the second initialization thin film transistor T7 is connected to the previous scan line SL−1. The second initialization source electrode S7 of the second initialization thin film transistor T7 is connected to the emission control drain electrode D6 of the emission control thin film transistor T6 and to the pixel electrode of the main organic light-emitting diode OLED. The second initialization drain electrode D7 of the second initialization thin film transistor T7 is connected to the first initialization source electrode S4 of the first initialization thin film transistor T4 and the initialization voltage line VL. The second initialization thin film transistor T7 is turned on in response to the previous scan signal Sn−1 received through the previous scan line SL−1 and initializes the pixel electrode of the main organic light-emitting diode OLED.

Although FIG. 4B illustrates that the first initialization thin film transistor T4 and the second initialization thin film transistor T7 are connected to the previous scan line SL−1, the present disclosure is not limited thereto. According to an exemplary embodiment of the present inventive concept, the first initialization thin film transistor T4 is connected to the previous scan line SL−1 and driven by the previous scan signal Sn−1, and the second initialization thin film transistor T7 is connected to a separate signal line, for example, a subsequent scan line, and driven by a signal transmitted through the signal line.

A second storage capacitor plate Cst2 of the storage capacitor Cst is connected to the driving voltage line PL. The counter electrode of the OLED is connected to the common voltage ELVSS. Accordingly, the OLED may display an image by receiving the driving current $I_{OLED}$ from the driving thin film transistor T1 and emitting light accordingly.

Although FIG. 4B illustrates that the compensation thin film transistor T3 and the first initialization thin film transistor T4 have a dual gate electrode, the compensation thin film transistor T3 and the first initialization thin film transistor T4 may have one gate electrode.

As such, each of the main pixels Pm configured for the AM driving includes at least one thin film transistor so that each of the main pixels Pm may be controlled by the at least one thin film transistor. The main pixels Pm driven by an AM driving method may implement a high resolution with a low consumption power.

Figure 5:
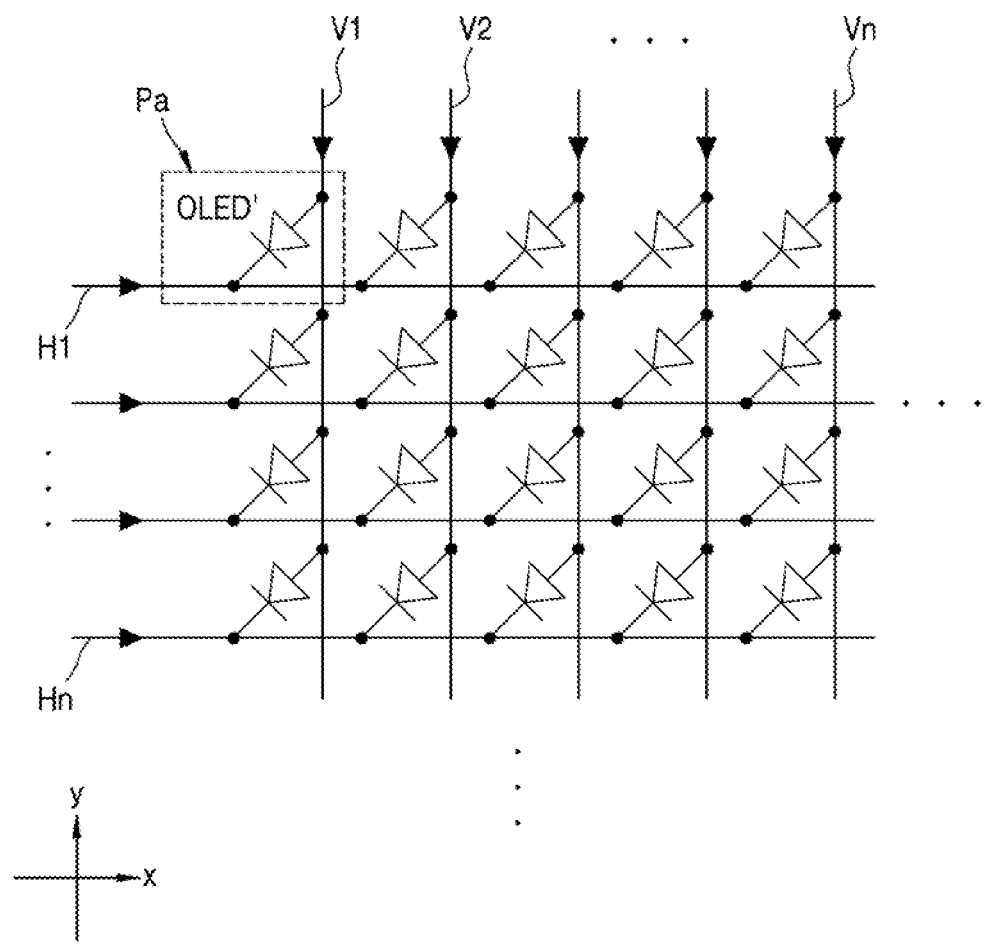
FIG. 5 is an equivalent circuit diagram illustrating pixels configured to be driven by passive matrix driving that may be disposed in a sensor area of a display apparatus, according to an exemplary embodiment of the present inventive concept.

FIG. 5 illustrates an arrangement of the auxiliary pixels Pa, according to an exemplary embodiment of the present inventive concept.

Referring to FIG. 5, the auxiliary pixels Pa configured to be driven by PM driving does not include a thin film transistor that drives each of the auxiliary pixels Pa. The auxiliary pixels Pa configured for PM driving may be formed as a plurality of vertical electrodes V1, . . . , Vn extending primarily in the x-direction and a plurality of the horizontal electrodes H1, . . . , Hn extending primarily in a y-direction intersect each other. The vertical electrodes V1, . . . , Vn may constitute a part of the pixel electrode of each of the auxiliary organic light-emitting diodes OLED'. The horizontal electrodes H1, . . . , Hn may constitute a part of the counter electrode of each of the auxiliary organic light-emitting diodes OLED'. An intermediate layer including an organic light-emitting layer is provided between the vertical electrodes V1, . . . , Vn and the horizontal electrodes H1, . . . , Hn. The auxiliary pixels Pa may emit light based on a voltage difference between the vertical electrodes V1, . . . , Vn and the horizontal electrodes H1, . . . , Hn.

The horizontal electrodes H1, . . . , Hn and the vertical electrodes V1, . . . , Vn may be connected to the auxiliary thin film transistor TFT' or driving circuit unit to drive the auxiliary pixels Pa. Accordingly, after sequentially selecting the horizontal electrodes H1, . . . , Hn, an image may be implemented by providing a voltage to the vertical electrodes V1, . . . , Vn including the auxiliary pixels Pa that emit light.

According to exemplary embodiments of the present inventive concept, a component such as a sensor may be disposed under the substrate 100 to correspond to the sensor area SA. The component may include an emission unit that emits light, for example, an infrared light of a wavelength of 940 nm. When a thin film transistor is disposed in the sensor area SA, performance of the thin film transistor may become unstable, for example, a photo current flows or driving ranged changes by the light emitted from the component.

According to exemplary embodiments of the present inventive concept, the auxiliary pixels Pa configured for PM driving, in which a thin film transistor is disposed, is disposed in the sensor area SA. The sensor area SA where a sensor may be disposed may simultaneously provide an image.

Figure 6:
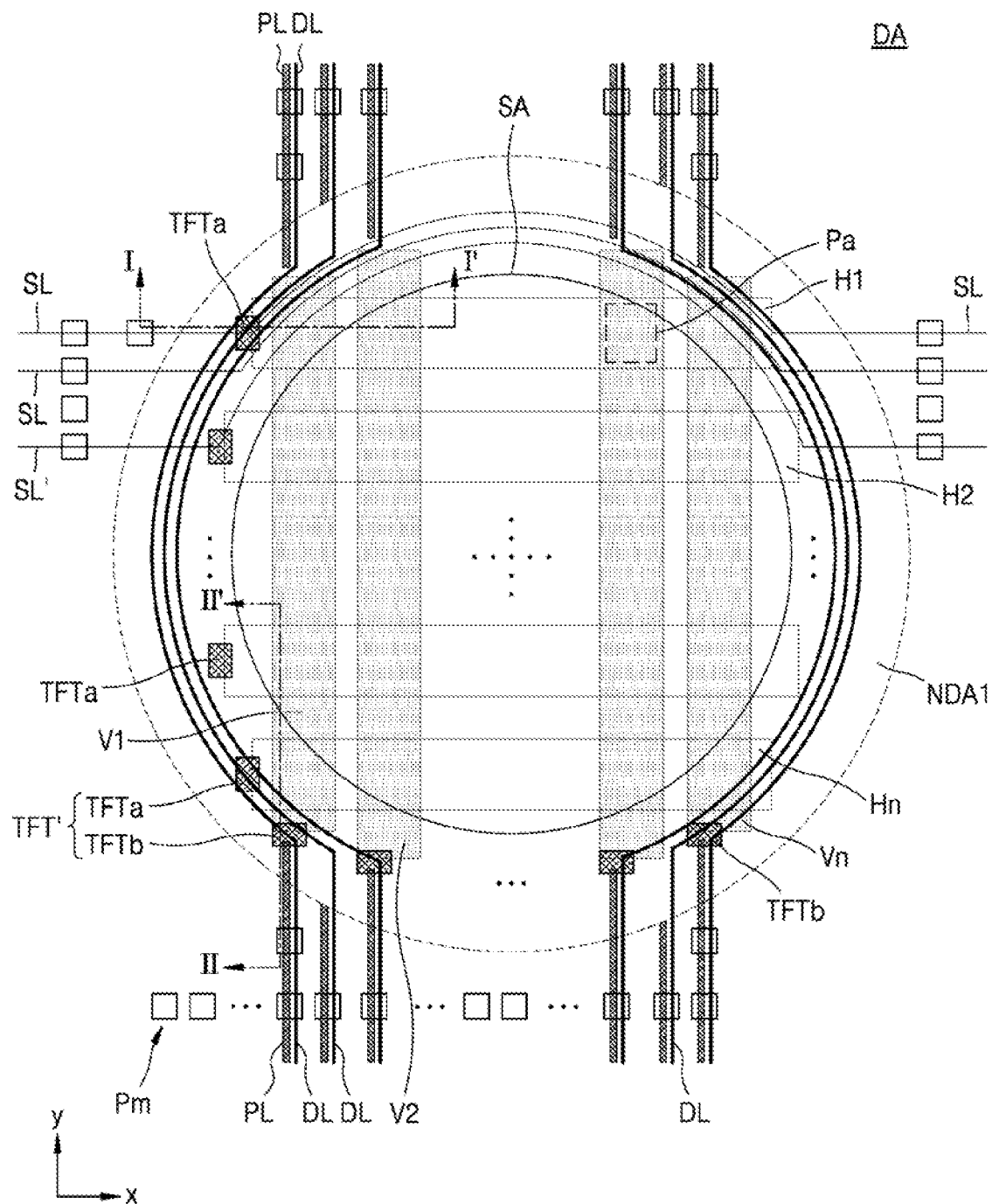
FIG. 6 is a schematic plan view illustrating a sensor area and a peripheral area of a display apparatus, according to an exemplary embodiment of the present inventive concept.
Figure 7:
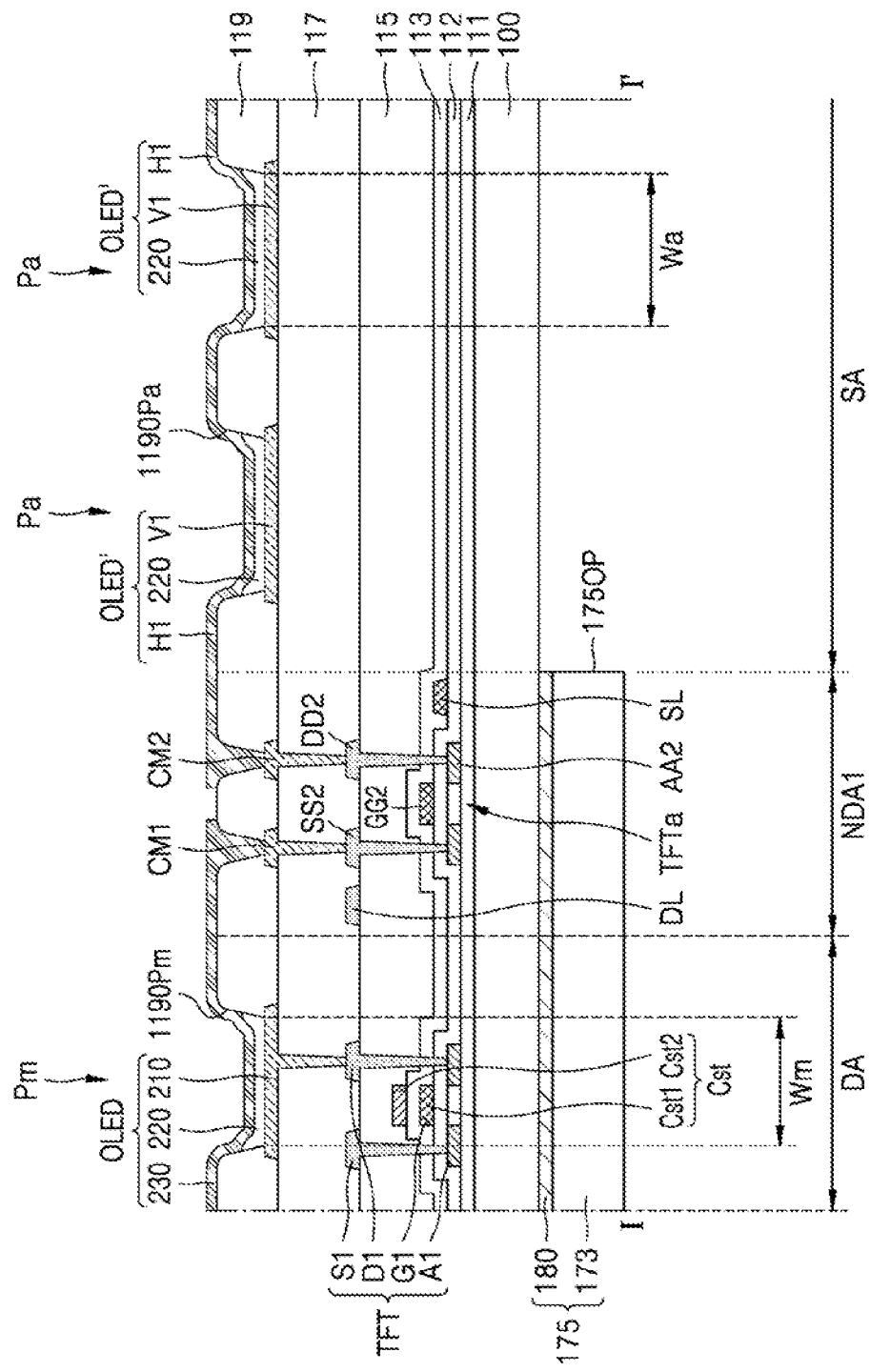
FIG. 7 is a schematic cross-sectional view taken along line I-I' of FIG. 6.
Figure 8:
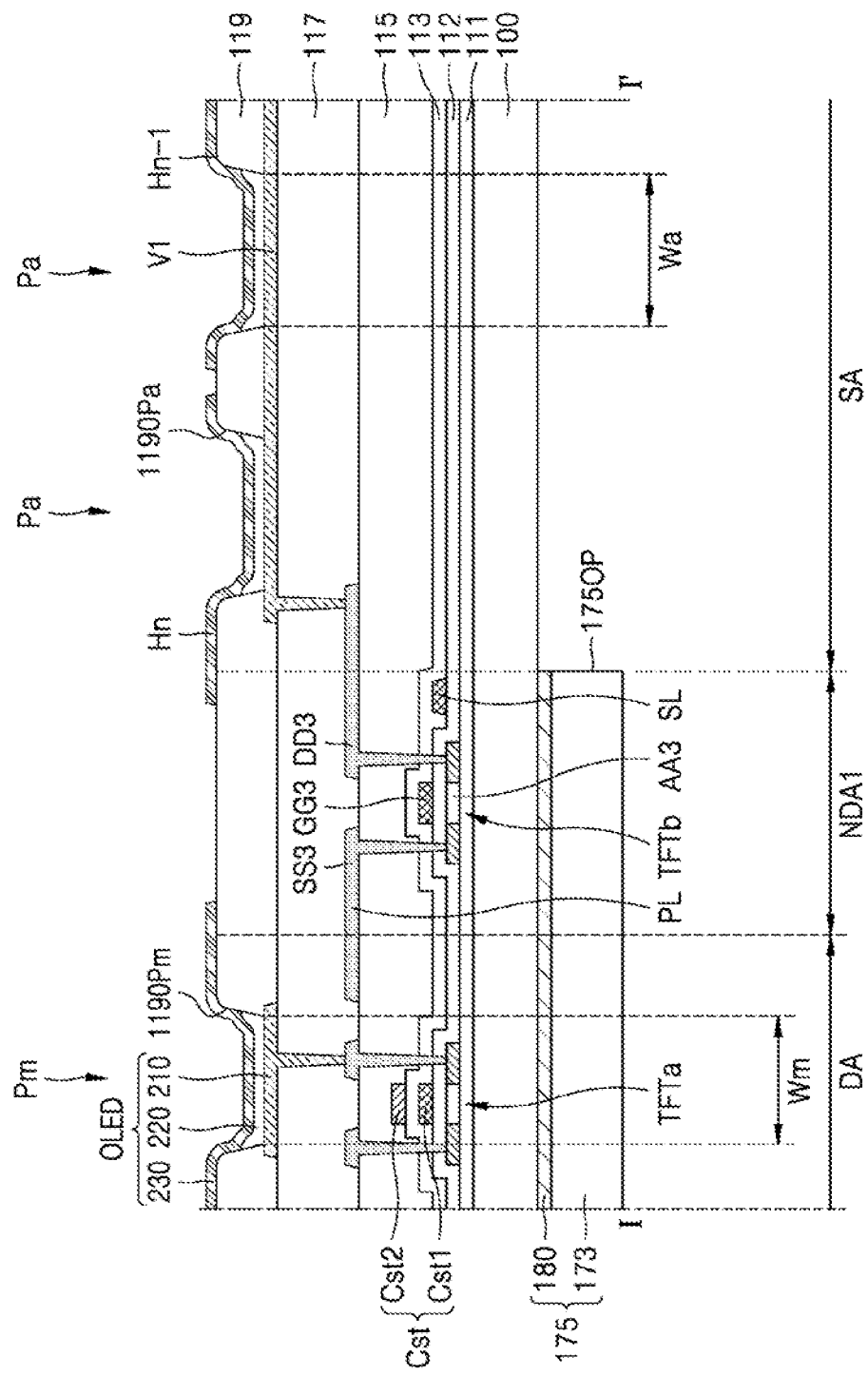
FIG. 8 is a schematic cross-sectional view taken along line II-II' of FIG. 6.

FIG. 6 is a schematic plan view illustrating the sensor area SA and a peripheral area thereof, according to an exemplary embodiment of the present inventive concept. FIG. 7 is a schematic cross-sectional view taken along line I-I' of FIG. 6. FIG. 8 is a schematic cross-sectional view taken along line II-II' of FIG. 6.

Referring to FIG. 6, the horizontal electrodes H1, . . . , Hn extending primarily in the x-direction and the vertical electrodes V1, . . . Vn extending primarily in the y-direction are disposed in the sensor area SA and intersect each other. A plurality of intersections where the horizontal electrodes H1, . . . , Hn and the vertical electrodes V1, . . . Vn intersect each other may be implemented as the auxiliary pixels Pa.

Although FIG. 6 illustrates that the area of one of the auxiliary pixels Pa is greater than the area of one of the main pixels Pm, the present disclosure is not limited thereto. As the horizontal electrodes H1, . . . , Hn and the vertical electrodes V1, . . . Vn are relatively small, as a result, the area of one of the auxiliary pixels Pa may be smaller than the area of one of the main pixels Pm. When the width of the horizontal electrodes H1, . . . , Hn and/or the width of the vertical electrodes V1, . . . Vn are reduced, such reduction may increase light transmittance of the sensor area SA.

The auxiliary thin film transistor TFT' for driving of the auxiliary pixels Pa may be disposed in the first non-display area NDA1 surrounding the sensor area SA. The auxiliary thin film transistor TFT' may include a plurality of first auxiliary thin film transistors TFTa connected to the horizontal electrodes H1, . . . , Hn and a plurality of second auxiliary thin film transistors TFTb connected to the vertical electrodes V1, . . . Vn. Although FIG. 6 illustrates that the first auxiliary thin film transistors TFTa are located at the left side of the sensor area SA and the second auxiliary thin film transistors TFTb are located at the lower side of the sensor area SA, the present disclosure is not limited thereto. For example, various changes are possible such that the first auxiliary thin film transistors TFTa may be located at the right side of the sensor area SA and the second auxiliary thin film transistors TFTb may be located at the upper side of the sensor area SA.

The first auxiliary thin film transistor TFTa may be connected to the scan line SL extending from the display area DA to receive the scan signal. In response to the scan signal, the second power voltage ELVSS may be provided to the horizontal electrodes H1, . . . , Hn. In some exemplary embodiments of the present inventive concept, the scan line SL may be connected to the main pixels Pm disposed in the display area DA. In some exemplary embodiments of the present inventive concept, the scan line SL may correspond to any one of the scan line SL connected to the main pixels Pm, the previous scan line SL−1, and the emission control line EL. However, the present disclosure is not limited thereto. The scan line SL connected to the first auxiliary thin film transistor TFTa may be a line that is not connected to the main pixels Pm and is directly connected to the first and second scan driving circuits 110 and 120 (see FIG. 3).

A gate electrode of the first auxiliary thin film transistor TFTa is connected to the scan line SL for transmitting the scan signal. Either the source or the drain electrode of the first auxiliary thin film transistor TFTa may be connected to the counter electrode included in the main pixels Pm, and the other electrode may be connected to the horizontal electrodes H1, . . . , Hn. In response to the scan signal, the first auxiliary thin film transistor TFTa is turned on, and thus the second power voltage ELVSS applied to the counter electrode included in the main pixels Pm may be transmitted to the horizontal electrodes H1, . . . , Hn.

The second auxiliary thin film transistor TFTb may be connected to the data line DL extending from the display area DA to receive the data signal. In response to the data signal, the first power voltage ELVDD may be provided to the vertical electrodes V1, . . . Vn. In some exemplary embodiments of the present inventive concept, the data line DL may be connected to the main pixels Pm disposed in the display area DA. However, the present disclosure is not limited thereto. The data line DL connected to the second auxiliary thin film transistor TFTb may be a line that is not connected to the main pixels Pm and is directly connected to the data driving circuit 150 (see FIG. 3).

A gate electrode of the second auxiliary thin film transistor TFTb may be connected to the data line DL for transmitting the data signal. Either the source electrode or the drain electrode of the second auxiliary thin film transistor TFTb may be connected to the driving voltage line PL, and the other electrode may be connected to the vertical electrodes V1, . . . Vn. In response to the data signal, the second auxiliary thin film transistor TFTb is turned on, and thus the first power voltage ELVDD provided through the driving voltage line PL may be transmitted to the vertical electrodes V1, . . . Vn.

A plurality of lines may be disposed in the first non-display area NDA1. The data lines DL may extend primarily in the y-direction, and the driving voltage lines PL may also extend primarily in the y-direction. The driving voltage lines PL around the sensor area SA may be short-circuited with respect to the sensor area SA. The short-circuited driving voltage lines PL at the upper side of the sensor area SA may be connected to the second sub-line 163 described above with reference to FIG. 3, whereas the short-circuited driving voltage lines PL at the lower side of the sensor area SA may be connected to the first sub-line 162. Some of the driving voltage lines PL may be connected to the second auxiliary thin film transistor TFTb.

Some of the data lines DL may bypass the sensor area SA. For example, each of the data lines DL may include a portion extending primarily in the y-direction and a portion detouring an edge of the sensor area SA by bypassing the sensor area SA. The detouring portion of each of the data lines DL may be located in the first non-display area NDA1. Some of the data lines DL disposed at the lower side of the sensor area SA may be connected to the second auxiliary thin film transistor TFTb. Some of the data lines DL may be disposed between the data lines DL connected to the second auxiliary thin film transistor TFTb, without being connected to the second auxiliary thin film transistor TFTb. This may be because the resolution of the display area DA and the resolution of the sensor area SA are implemented to be different from each other. For example, the resolution of the display area DA may be implemented to be higher than the resolution of the sensor area SA.

The main pixels Pm disposed at the upper and lower sides of the sensor area SA may be electrically connected to the data line DL that bypasses the sensor area SA, and may receive the signal from the data line DL corresponding thereto. Some of the data lines DL may be curved along the left edge of the sensor area SA, and the other data lines DL may be curved along the right edge of the sensor area SA.

The scan lines SL may extend in the x-direction intersecting the data lines DL. Some of the scan lines SL may bypass the sensor area SA. For example, some of the scan lines SL may be curved along the upper edge of the sensor area SA, and the others scan lines SL may be curved along the lower edge of the sensor area SA. Each of the scan lines SL may include a portion extending from the display area DA primarily in the x-direction and a portion, or a curved portion, detouring the edge of the sensor area SA by bypassing the sensor area SA in the first non-display area NDA1. The main pixels Pm located at the left and right sides of the sensor area SA may be electrically connected to the scan lines SL bypassing the opening area OA.

Some of the scan lines SL disposed at the left side of the sensor area SA may be connected to the first auxiliary thin film transistor TFTa. Some of the scan lines SL may be disposed between the scan lines DL connected to the first auxiliary thin film transistor TFTa, without being connected to the first auxiliary thin film transistor TFTa. This may be because the resolution of the display area DA and the resolution of the sensor area SA are implemented to be different from each other. For example, the resolution of the display area DA may be implemented to be higher than the resolution of the sensor area SA.

A stack structure of the display apparatus 1 according to an exemplary embodiment of the present inventive concept is described with reference to FIGS. 7 and 8.

The substrate 100 may include a glass material, a ceramic material, a metal material, and/or a material having flexible or bendable characteristics. When the substrate 100 has the flexible or bendable characteristics, the substrate 100 may include polymer resin such as PES, PAR, PE, PEN, PET, PPS, polyarylate, PI, PC, and/or CAP. The substrate 100 may have a monolayer or multilayer structure of the material. For the multilayer structure, the substrate 100 may further include an inorganic layer. In some exemplary embodiments of the present inventive concept, the substrate 100 may have a structure of an organic material/an inorganic material/an organic material.

A buffer layer 111 may be disposed on the substrate 100, and may reduce or prevent intrusion of foreign materials, moisture, or external air from a lower portion of the substrate 100 and provide a planarized surface on the substrate 100. The buffer layer 111 may include an inorganic material such as an oxide or a nitride, an organic material, or an organic/inorganic composite, and may have a monolayer or multilayer structure of an inorganic material and an organic material.

A barrier layer may be further provided between the substrate 100 and the buffer layer 111. The barrier layer may prevent or reduce intrusion of impurities from the substrate 100 into a semiconductor layer A1. The barrier layer may include an inorganic material such as an oxide or a nitride, an organic material, or an organic/inorganic composite, and may have a monolayer or multilayer structure of an inorganic material and an organic material.

The substrate 100 may be sectioned into the display area DA, the first non-display area NDA1, and the sensor area SA. The main thin film transistor TFT for driving the main pixels Pm may be disposed in the display area DA. The auxiliary thin film transistor TFT' for driving the auxiliary pixels Pa may be disposed in the first non-display area NDA1.

Semiconductor layers A1, AA2, and AA3 may be disposed on the buffer layer 111. The semiconductor layers A1, AA2, and AA3 may include amorphous silicon or polysilicon. According to an exemplary embodiment of the present inventive concept, the semiconductor layers A1, AA2, and AA3 may include an oxide of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and/or zinc (Zn). In some exemplary embodiments of the present inventive concept, the semiconductor layers A1, AA2, and AA3 may include a Zn oxide based material, for example, a Zn oxide, an In—Zn oxide, or a Ga—In—Zn oxide. According to an exemplary embodiment of the present inventive concept, the semiconductor layers A1, AA2, and AA3 may each include IGZO (In—Ga—Zn—O), ITZO (In—Sn—Zn—O), and/or IGTZO (In—Ga—Sn—Zn—O) semiconductor in which metal such as In, Ga, and/or Sn is included in ZnO. The semiconductor layers A1, AA2, and AA3 may include a channel region, a source region, and a drain region. The source and drain regions are disposed at opposite sides of the channel region. The semiconductor layers A1, AA2, and AA3 may be configured in a monolayer or multilayer.

Gate electrodes G1, GG2, and GG3 are disposed on the semiconductor layers A1, AA2, and AA3, at least partially overlapping the semiconductor layers A1, AA2, and AA3, with a first gate insulating layer 112 interposed therebetween. The gate electrodes G1, GG2, and GG3 each may include molybdenum (Mo), aluminum (Al), copper (Cu), and/or titanium (Ti) and may be formed in a monolayer or multilayer. As an example, the gate electrodes G1, GG2, and GG3 each may be formed in a monolayer of Mo. The scan line SL may include the same material on the same layer as the gate electrodes G1, GG2, and GG3.

The first gate insulating layer 112 may include a silicon oxide ($SiO_2$), a silicon nitride (SiNx), a silicon oxynitride (SiON), an aluminum oxide ($Al_2O_3$), a titanium oxide ($TiO_2$), a tantalum oxide ($Ta_2O_5$), a hafnium oxide ($HfO_2$), or a zinc oxide ($ZnO_2$).

A second gate insulating layer 113 may cover the gate electrodes G1, GG2, and GG3 and the scan line SL. The second gate insulating layer 113 may include $SiO_2$, SiNx, SiON, $Al_2O_3$, $TiO_2$, $Ta_2O_5$, $HfO_2$, or $ZnO_2$.

The first storage capacitor plate Cst1 of the storage capacitor Cst disposed in the display area DA may at least partially overlap the TFT. For example, the gate electrode G1 of TFT may perform a function as the first storage capacitor plate Cst1 of the storage capacitor Cst.

The second storage capacitor plate Cst2 of the storage capacitor Cst at least partially overlaps a first electrode CE1 with the second gate insulating layer 113 therebetween. In this case, the second gate insulating layer 113 may function as a dielectric layer of the storage capacitor Cst. The second storage capacitor plate Cst2 may include a conductive material including Mo, Al, Cu, and/or Ti, and may be formed as a multilayer or monolayer including the above material. As an example, the second storage capacitor plate Cst2 may be in a monolayer of Mo or a multilayer of Mo/Al/Mo.

Although FIG. 7 illustrates that the storage capacitor Cst overlaps the TFT, the present disclosure is not limited thereto. In this regard, various modifications may be available, for example, the storage capacitor Cst may be disposed so as not to overlap the TFT.

An interlayer insulating layer 115 may cover the second storage capacitor plate Cst2 of the storage capacitor Cst. The interlayer insulating layer 115 may include $SiO_2$, SiNx, SiON, $Al_2O_3$, $TiO_2$, $Ta_2O_5$, $HfO_2$, and/or $ZnO_2$.

The source electrodes S1, SS2, and SS3, the drain electrodes D1, DD2, and DD3, the data line DL, and the driving voltage line PL may be arranged on the interlayer insulating layer 115. The source electrodes S1, SS2, and SS3, the drain electrodes D1, DD2, and DD3, the data line DL, and the driving voltage line PL may include a conductive material including Mo, Al, Cu, and/or Ti, and may be in a multilayer or monolayer including the above material. As an example, the source electrodes S1, SS2, and SS3 and the drain electrodes D1, DD2, and DD3 may have a structure of a multilayer of Ti/Al/Ti.

A via layer 117 may be disposed on the source electrodes S1, SS2, and SS3, the drain electrodes D1, DD2, and DD3, the data line DL, and the driving voltage line PL. The main organic light-emitting diode OLED and the auxiliary organic light-emitting diode OLED' may be disposed on the via layer 117.

The via layer 117 may have a flat upper surface so that a pixel electrode 210 is flat. The via layer 117 may be a film formed of an organic material in a monolayer or multilayer. The via layer 117 may include a general polymer for general use such as benzocyclobutene (BCB), polyimide, hexamethyldisiloxane (HMDSO), polymethylmethacrylate (PMMA), or polystyrene (PS), a polymer derivative having a phenol group, an acrylic polymer, an imide polymer, an aryl ether polymer, an amide polymer, a fluorine polymer, a p-xylene polymer, a vinyl alcohol polymer, or a blend thereof. The via layer 117 may include an inorganic material. The via layer 117 may include $SiO_2$, SiNx, SiON, $Al_2O_3$, $TiO_2$, $Ta_2O_5$, $HfO_2$, or $ZnO_2$. When the via layer 117 includes an inorganic material, in some cases, chemical planarization polishing may be performed. The via layer 117 may include both of an organic material and an inorganic material.

In the display area DA of the substrate 100, the main organic light-emitting diode OLED is disposed on the via layer 117. The main organic light-emitting diode OLED may include the pixel electrode 210, an intermediate layer 220 including an organic light-emitting layer, and a counter electrode 230.

In the sensor area SA of the substrate 100, the auxiliary organic light-emitting diode OLED' is disposed on the via layer 117. The auxiliary organic light-emitting diode OLED' may include a vertical electrode V1, the intermediate layer 220 including an organic light-emitting layer, and a horizontal electrode H1.

The pixel electrode 210 and the vertical electrodes V1 and V2 may be disposed on the same layer and may include the same material. The pixel electrode 210 and the vertical electrodes V1 and V2 may be (semi-) transmissive electrodes or reflective electrodes. In some embodiments, the pixel electrode 210 and the vertical electrode V1 may include a reflecting film including Ag, Mg, Al, Pt, Pd, Au, Ni, Nd, Ir, Cr and/or a compound thereof, and a transparent or semi-transparent electrode layer formed on the reflecting film. The transparent or semi-transparent electrode layer may include an oxide such as an indium tin oxide (ITO), an indium zinc oxide (IZO), a zinc oxide (ZnO), an indium oxide ($In_2O_3$), an indium gallium oxide (IGO), and/or an aluminum zinc oxide (AZO). In some embodiments, the pixel electrode 210 and the vertical electrodes V1 and V2 may have a stack structure of ITO/Ag/ITO. However, the present disclosure is not limited thereto.

The vertical electrodes V1 and V2 may be disposed on a layer different from the pixel electrode 210 and may include a different material. In this regard, various modifications may be available, for example, the vertical electrode V1 may include only a transparent electrode layer to improve translucency compared to the pixel electrode 210.

A pixel defining film 119 may be disposed on the via layer 117. The pixel defining film 119 may have, in the display area DA, a main opening portion corresponding to each of the pixel electrodes 210, for example, a main opening portion 119OPm that exposes at least a center portion of the pixel electrode 210, thereby defining a light-emitting area of the main pixels Pm. The pixel defining film 119 may have, in the sensor area SA, an auxiliary opening portion 119OPa that exposes a part of the vertical electrode V1, corresponding to each of the auxiliary pixels Pa, thereby defining a light-emitting area of the auxiliary pixels Pa.

A width Wm of the main opening portion 119OPm may be less than a width Wa of the auxiliary opening portion 119OPa (Wm<Wa). This is because the main pixels Pm disposed in the resolution of the display area DA are greater than the auxiliary pixels Pa disposed in the resolution of the sensor area SA.

Furthermore, the pixel defining film 119 may prevent arcing at the edge of the pixel electrode 210 by increasing a distance between the edge of the pixel electrode 210 and the counter electrode 230 above the pixel electrode 210. The pixel defining film 119 may include an organic insulating material such as polyimide, polyamide, acryl resin, BCB, HMDSO, and/or phenol resin, by a method such as spin coating.

The intermediate layer 220 of the main organic light-emitting diode OLED and the auxiliary organic light-emitting diode OLED' may include an organic light-emitting layer. The organic light-emitting layer may include an organic material including a fluorescent or phosphorescent material that emits light of a red, green, blue, or white color. The organic light-emitting layer may include a low molecular organic material or a polymer organic material. A functional layer such as a hole transport layer (HTL), a hole injection layer (HIL), an electron transport layer (ETL), and an electron injection layer (EIL) may be selectively further arranged under and above the organic light-emitting layer. The intermediate layer 220 may be disposed corresponding to each of the main opening portions 119OPm and the auxiliary opening portions 119OPa of the pixel defining film 119. However, the present disclosure is not limited thereto.

In this regard, various modifications may be available, for example, the intermediate layer 220 may include an integrated layer across the substrate 100.

The counter electrode 230 and the horizontal electrodes H1 and Hn may include the same material as each other and may be disposed on a same layer. The counter electrode 230 and the horizontal electrodes H1 and Hn may be transmissive electrodes or reflective electrodes. In some exemplary embodiments of the present inventive concept, the counter electrode 230 and the horizontal electrodes H1 and Hn may each be transparent or semi-transparent electrodes, and may be formed as a metal thin film having a work function including Li, Ca, LiF/Ca, LiF/Al, Al, Ag, Mg and/or a compound thereof. Furthermore, a transparent conductive oxide (TCO) film such as ITO, IZO, ZnO, and/or $In_2O_3$ may be further provided on the metal thin film.

The counter electrode 230 may be dispose across the display area DA and above the intermediate layer 220 and the pixel defining film 119. The counter electrode 230 may be integrally formed with respect to the main organic light-emitting diodes OLED's to correspond to the pixel electrodes 210. The horizontal electrodes H1 and Hn may be spaced apart from each other in the sensor area SA and also spaced apart from the counter electrode 230.

When the pixel electrode 210 is provided as a reflective electrode and the counter electrode 230 is provided as a transmissive electrode, the light emitted from the intermediate layer 220 is emitted toward the counter electrode 230, and thus the display apparatus 1 may be implemented as a top emission type. When the pixel electrode 210 is provided as a transparent or semi-transparent electrode and the counter electrode 230 is provided as a reflective electrode, the light emitted from the intermediate layer 220 is emitted toward the substrate 100, and thus the display apparatus 1 may be implemented as a bottom emission type. However, the present disclosure is not limited thereto, and the display apparatus 1 according to the present embodiment may be implemented as a dual emission type that emits light in both directions of a top surface and a bottom surface.

The first auxiliary thin film transistor TFTa may include the semiconductor layer A2, the gate electrode GG2, the source electrode SS2, and the drain electrode DD2. The gate electrode GG2 of the first auxiliary thin film transistor TFTa may be connected to the scan line SL and may receive application of the scan signal.

The source electrode SS2 of the first auxiliary thin film transistor TFTa may be electrically connected to the counter electrode 230. For example, the source electrode SS2 of the first auxiliary thin film transistor TFTa may be connected to the counter electrode 230 via a through hole penetrating the pixel defining film 119 and the via layer 117. In this state, a first connection electrode CM1 may be provided as an intermediary element. For example, the counter electrode 230 may be connected to the first connection electrode CM1 via a through hole defined in the pixel defining film 119, and the first connection electrode CM1 may be connected to the source electrode S2 via a through hole defined in the via layer 117.

The drain electrode DD2 of the first auxiliary thin film transistor TFTa may be electrically connected to the horizontal electrode H1. For example, the drain electrode DD2 of the first auxiliary thin film transistor TFTa may be connected to the horizontal electrode H1 via a through hole penetrating the pixel defining film 119 and the via layer 117. In this state, a second connection electrode CM2 may be provided as an intermediary element. For example, the counter electrode 230 may be connected to the second connection electrode CM2 via a through hole defined in the pixel defining film 119, and the second connection electrode CM2 may be connected to the drain electrode SS2 via a through hole defined in the via layer 117.

The first auxiliary thin film transistor TFTa may transmit the second power voltage ELVSS applied to the counter electrode 230 to the horizontal electrode H1, in response to the scan signal applied to the gate electrode GG2.

The second auxiliary thin film transistor TFTb may include the semiconductor layer AA3, the gate electrode GG3, the source electrode SS3, and the drain electrode DD3. The gate electrode GG3 of the second auxiliary thin film transistor TFTb may be electrically connected to the data line DL and may receive application of the data signal.

The source electrode SS3 of the second auxiliary thin film transistor TFTb may be connected to the driving voltage line PL. The source electrode SS3 may be provided as a part of the driving voltage line PL.

The drain electrode DD3 of the second auxiliary thin film transistor TFTb may be electrically connected to the vertical electrode V1. For example, the drain electrode DD3 of the second auxiliary thin film transistor TFTb may be connected to the vertical electrode V1 via a through hole penetrating the via layer 117.

The second auxiliary thin film transistor TFTb may transmit the first power voltage ELVDD transmitted through the driving voltage line PL to the vertical electrode V1, in response to the data signal applied to the gate electrode GG2.

The lower protective film 175 may be disposed on a lower surface of the substrate 100. The lower protective film 175 may include a protective film base 173 and an adhesive layer 180. The protective film base 173 may be attached to the lower surface of the substrate 100 by the adhesive layer 180.

The protective film base 173 may include PET and/or PI. The adhesive layer 180 may include pressure sensitive adhesive (PSA).

The lower protective film 175 may include the opening 175OP corresponding to the sensor area SA, and a component arranged to correspond to the sensor area SA may be disposed at least partially in the opening 175OP.

A seal member for sealing the main and auxiliary organic light-emitting diodes OLED and OLED' may be further provided above the same, components such as a touch sensor layer, a polarized layer, a color filter layer, or a window may be further provided above the seal member.

Although in FIGS. 6 to 8 the auxiliary thin film transistor TFT' for driving the auxiliary pixels Pa disposed in the sensor area SA is disposed in the first non-display area NDA1, the present disclosure is not limited thereto. The auxiliary thin film transistor TFT' might not be disposed in the first non-display area NDA1.

Figure 9:
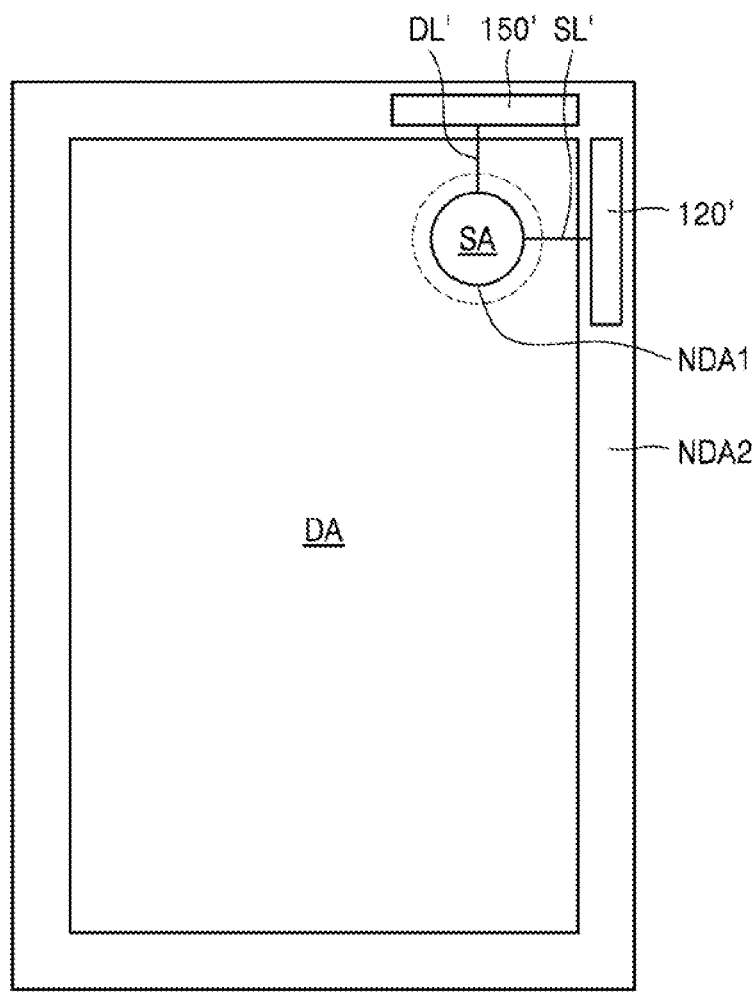
FIG. 9 is a schematic plan view illustrating a display apparatus according to an exemplary embodiment of the present inventive concept.

For example, as in another embodiment illustrated in FIG. 9, an auxiliary scan driving circuit 120' and an auxiliary the data driving circuit 150' are disposed in the second non-display area NDA2 outside the display area DA, the driving voltage and signal may be transmitted to the sensor area SA.

According to exemplary embodiments of the present inventive concept, the auxiliary pixels Pa configured for PM driving are disposed in the sensor area SA, and the auxiliary pixels Pa are located in a region where plurality of horizontal electrodes extending primarily in a first direction and a plurality of vertical electrodes extending primarily in a second direction crossing the first direction intersect each other.

An auxiliary scan line SL' of the auxiliary scan driving circuit 120' may be directly connected to the horizontal electrodes disposed in the sensor area SA. An auxiliary data line DL' of the auxiliary the data driving circuit 150' may be directly connected to the vertical electrodes disposed in the sensor area SA.

According to exemplary embodiments of the present inventive concept, lines for transmitting a voltage and/or signal to the main pixels disposed in the display area DA may be disposed in the first non-display area NDA1 by detouring the sensor area SA.

As described above, according to the above-described embodiments, as auxiliary pixels configured for PM driving are disposed in a sensor area corresponding to a component such as a sensor, an environment for operation of the sensor may be established and simultaneously an image may be implemented in an area overlapping the sensor.

Accordingly, a display apparatus capable of various functions and providing increased quality may be provided.

Descriptions of features or aspects within each embodiment may be considered as available for other similar features or aspects in other embodiments, and so the present inventive concept contemplate any possible combination of elements and features across the several exemplary embodiments described herein.

While one or more embodiments have been described with reference to the figures, it will be understood by those of ordinary skill in the art that various changes in form and details may be made therein without departing from the spirit and scope of the present inventive concept.

What is claimed is:

1. A display apparatus, comprising:
   a substrate comprising a sensor area, a first non-display area at least partially surrounding the sensor area, and a main display area at least partially surrounding the first non-display area;
   a plurality of auxiliary pixels disposed in the sensor area and configured for passive matrix driving;
   a plurality of main pixels disposed in the main display area and configured for active matrix driving; and
   a plurality of auxiliary thin film transistors disposed in the first non-display area and configured to drive the plurality of auxiliary pixels,
   wherein an entirety of the sensor area is configured to transmit light or sound through the substrate and display an auxiliary image on the substrate using the plurality of auxiliary pixels by passive matrix driving.

2. The display apparatus of claim 1, further comprising a component arranged on a lower surface of the substrate such that the component corresponds to the sensor area.

3. The display apparatus of claim 1, wherein each of the plurality of auxiliary pixels is located in a region where a plurality of horizontal electrodes extending primarily in a first direction and a plurality of vertical electrodes extending primarily in a second direction crossing the first direction intersect each other.

4. The display apparatus of claim 1, wherein each of the plurality of main pixels comprises at least one thin-film transistor.

5. A display apparatus, comprising:
   a substrate comprising a sensor area, a first non-display area at least partially surrounding the sensor area, and a main display area at least partially surrounding the first non-display area;
   a plurality of auxiliary pixels disposed in the sensor area and configured for passive matrix driving;
   a plurality of main pixels disposed in the main display area and configured for active matrix driving; and a plurality of auxiliary thin film transistors disposed in the first non-display area and configured to drive the plurality of auxiliary pixels, wherein each of the plurality of auxiliary pixels comprises a horizontal electrode, a vertical electrode, and an intermediate layer arranged between the horizontal electrode and the vertical electrode, and wherein each of the plurality of auxiliary thin film transistors comprises a first auxiliary thin film transistor connected to the horizontal electrode and a second auxiliary thin film transistor connected to the vertical electrode.

6. The display apparatus of claim 5, wherein each of the plurality of main pixels comprises a pixel electrode, an intermediate layer, and a counter electrode, and wherein either a source electrode or a drain electrode of the first auxiliary thin film transistor is connected to the counter electrode.

7. The display apparatus of claim 6, wherein a gate electrode of the second auxiliary thin film transistor is connected to a scan line configured for transmitting a scar signal to the plurality of main pixels.

8. The display apparatus of claim 5, wherein either a source electrode or a drain electrode of the second auxiliary thin film transistor is connected to a driving voltage line located in the main display area.

9. The display apparatus of claim 1, further comprising a lower protective film disposed cm a lower surface of the substrate, wherein the lower protective film comprises an opening corresponding to the sensor area.

10. The display apparatus of claim 1, further comprising a plural of lines extending from the main display area, arranged in the first non-display area, and detouring along an edge of the sensor area.

11. The display apparatus of claim 10, wherein each of the plurality of lines comprises a curved portion in the first non-display area.

12. The display apparatus of claim 1, wherein a size of a light-emitting area of each of the plurality of auxiliary pixels is greater than a size of a light-emitting area of each of the plurality of main pixels.

13. The display apparatus of claim 1, wherein a resolution implemented in the sensor area is within a range of about 50 ppi to about 400 ppi.

14. A display apparatus, comprising:
a substrate comprising an auxiliary pixel area, a first non-display area at least partially surrounding the auxiliary pixel area, and a main display area at least partially surrounding the first non-display area;
a plurality of auxiliary pixels disposed in the auxiliary pixel area and configured for passive matrix driving;
a plurality of main pixels disposed in the main display area and configured tor active matrix driving; and
a component disposed under the substrate to correspond to the auxiliary pixel area,
wherein each of the plurality of auxiliary pixels is located in a region where a plurality of horizontal electrodes extending primarily in a first direction and a plurality of vertical electrodes extending primarily in a second direction crossing the first direction intersect each other.

15. The display apparatus of claim 14, wherein the component is an infrared sensor.

16. The display apparatus of claim 14, wherein the auxiliary pixel area has a infrared transmittance of about 15% or more.

17. The display apparatus of claim 14, wherein a plurality of auxiliary thin film transistors configured for driving the plurality of auxiliary pixels is arranged in the first non-display area.

18. The display apparatus of claim 14, further comprising a plurality of lines extending from the main display area, arranged in the first non-display area, and detouring along an edge of the auxiliary pixel area.

19. The display apparatus of claim 14, further comprising a lower protective film disposed on a lower surface of the substrate, wherein the lower protective film comprises an opening corresponding to the auxiliary pixel area.

20. The display apparatus of claim 1, wherein the main display area is separated from the sensor area by the first non-display area.

* * * * *